(12) United States Patent
Majima

(10) Patent No.: US 12,216,149 B2
(45) Date of Patent: Feb. 4, 2025

(54) DEGRADATION DETECTION DEVICE AND DEGRADATION DETECTION METHOD

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Hideaki Majima, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 761 days.

(21) Appl. No.: 17/408,041

(22) Filed: Aug. 20, 2021

(65) Prior Publication Data

US 2022/0091176 A1 Mar. 24, 2022

(30) Foreign Application Priority Data

Sep. 18, 2020 (JP) ................................. 2020-157657

(51) Int. Cl.
*G01R 31/26* (2020.01)
*H03K 5/24* (2006.01)

(52) U.S. Cl.
CPC ........... *G01R 31/2608* (2013.01); *H03K 5/24* (2013.01)

(58) Field of Classification Search
CPC ... G01R 31/2608; G01R 31/2621; H03K 5/24
See application file for complete search history.

(56) References Cited

U.S. PATENT DOCUMENTS

| 7,385,380 B2 | 6/2008 | Ishigaki et al. |
| 2003/0073256 A1* | 4/2003 | Tanimoto ........... G01R 31/2642 |
| | | 257/E21.525 |
| 2007/0262761 A1* | 11/2007 | Ishigaki ................ H02M 3/156 |
| | | 323/282 |

(Continued)

FOREIGN PATENT DOCUMENTS

| JP | H09-257870 A | 10/1997 |
| JP | 2005-045963 A | 2/2005 |
| JP | 4585454 B2 | 11/2010 |

(Continued)

OTHER PUBLICATIONS

T. Sugiyama et al., "Evaluation methodology for current collapse phenomenon of GaN HEMTs," 2018 IEEE International Reliability Physics Symposium (IRPS), Burlingame, CA, 2018.

(Continued)

*Primary Examiner* — Neel D Shah
*Assistant Examiner* — Adam S Clarke
(74) *Attorney, Agent, or Firm* — Kim & Stewart LLP

(57) ABSTRACT

According to one embodiment, a degradation detection device includes a driving circuit that supplies a driving signal that controls on/off of an output transistor to the output transistor and an output circuit that compares a value of integral of an output current that is output by the output transistor in an off-state thereof over a predetermined period of time with a predetermined threshold when the output transistor is turned from an on-state thereof to an off-state thereof and outputs a signal that indicates a degradation state of the output transistor depending on a result of such comparison.

18 Claims, 3 Drawing Sheets

(56) References Cited

U.S. PATENT DOCUMENTS

2011/0248702 A1    10/2011  Kume
2020/0241067 A1*  7/2020  Mohamed Halick .... G01D 3/08

FOREIGN PATENT DOCUMENTS

| JP | 2011-220767 A | 11/2011 |
|----|---------------|---------|
| JP | 2017-005974 A | 1/2017  |

OTHER PUBLICATIONS

Office Action and Preliminary Search Report issued Jun. 21, 2024 in Chinese Patent Application No. 202110906202.2 with English language machine translation, 11 pages.

* cited by examiner

DEGRADATION DETECTION DEVICE AND DEGRADATION DETECTION METHOD

CROSS-REFERENCE TO RELATED APPLICATIONS

The present application claims the benefit of priority to Japanese Patent Application No. 2020-157657 filed on Sep. 18, 2020, the entire contents of which Japanese Patent Application are incorporated by reference in the present application.

FIELD

Embodiments described herein relate generally to a degradation detection device and a degradation detection method.

BACKGROUND

A technique of a power source circuit that uses a gallium nitride (GaN) transistor as an output transistor has been disclosed conventionally. A switching element that is composed of a GaN transistor is of a high withstand voltage and a low loss, so that it is preferable for application to a power source circuit that outputs a high voltage. A study about a correlation between a charge that is stored in a GaN transistor (that will be referred to as a drain charge below) and an on-resistance thereof when the GaN transistor is provided in an on-state thereof has been executed. It is desirable to use an output transistor with a small on-resistance in order to reduce power consumption of a power source circuit. An increase of an on-resistance of an output transistor is an index that indicates that the output transistor is degraded. A degradation detection device and a degradation detection method are desired that are capable of readily detecting a degradation state of an output transistor.

DETAILED DESCRIPTION

According to one embodiment, a degradation detection device includes an output transistor with a main current path that is connected between a power source supply terminal and an output terminal, a driving circuit that supplies a driving signal that controls on/off of the output transistor to the output transistor, and an output circuit that compares a value of integral of an output current that is output by the output transistor in an off-state thereof over a predetermined period of time with a predetermined threshold when the output transistor is turned from an on-state thereof to an off-state thereof and outputs a signal that indicates a degradation state of the output transistor depending on a result of such comparison.

Hereinafter, a degradation detection device and a degradation detection method according to an embodiment will be explained in detail with reference to the accompanying drawings. Additionally, the present invention is not limited by these embodiments.

First Embodiment

Figure 1:
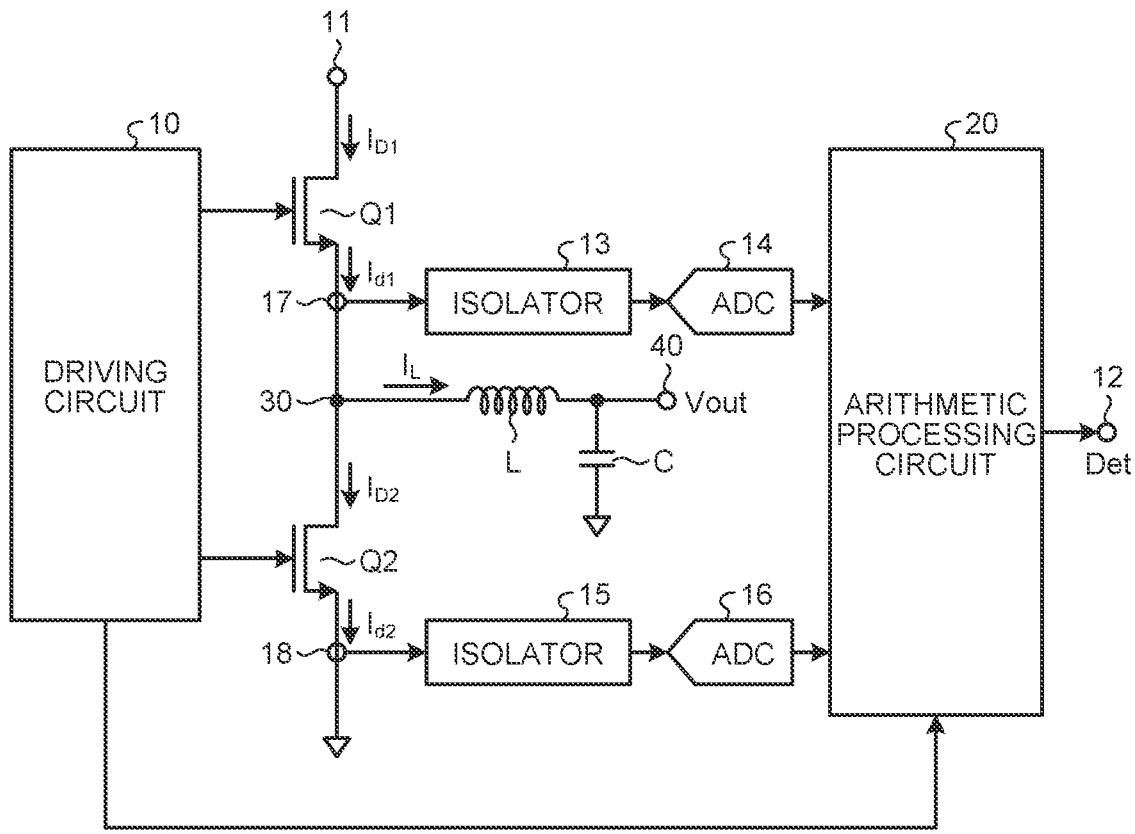
FIG. 1 is a diagram that illustrates a degradation detection device according to a first embodiment.

FIG. 1 is a diagram that illustrates a configuration of a degradation detection device according to a first embodiment. The present embodiment has an output transistor Q1 with a source-drain path that is a main current, path and is connected between a power source supply terminal 11 where a power source voltage is applied thereto and an output terminal 30. A DC input voltage is applied to the power source supply terminal 11. The output transistor Q1 is, for example, an N-channel-type GaN transistor where a material thereof is GaN. For a MOS transistor where a material thereof is GaN, a main current path between a drain and a source thereof is composed of GaN.

It has an output transistor Q2 with a source-drain path that is a main current path and is connected between the output terminal 30 and ground. The output transistor Q2 is, for example, an N-channel-type GaN transistor.

The present embodiment has a driving circuit 10 that supplies a driving signal that controls on/off of the output transistors Q1, Q2. The driving circuit 10 supplies a driving signal to the output transistors Q1, Q2 while a so-called dead time is provided in such a manner that a flow-through current is not generated between the power source supply terminal 11 and ground by preventing the output transistors Q1, Q2 from being simultaneously turned on. Information of a timing when a driving signal is supplied thereto is supplied from the driving circuit 10 to an arithmetic processing circuit 20.

One end of an inductor L is connected to the output terminal 30. The other end of the inductor L is connected to one end of an output capacitor C and is connected to an output terminal 40. The other end of the output capacitor C is grounded. A DC/DC converter is configured in such a manner that the output transistors Q1, Q2 are complementarily turned on/off so that an inductor current $I_L$ flows from the output terminal 30 to the inductor L and a predetermined DC output voltage Vout is output from the output terminal 40.

A current sensor 17 is provided between a source of the output transistor Q1 and the output terminal 30. A signal from the current sensor 17 is supplied to an isolator 13. The isolator 13 has a configuration where an input side and an output side thereof are electrically insulated. The isolator 13 has, for example, an inductive or capacitive configuration. An output signal from the isolator 13 is supplied to an AD conversion circuit 14. The AD conversion circuit 14 converts an output signal from the isolator 13 into a digital value and supplies it to the arithmetic processing circuit 20. The arithmetic processing circuit 20 is composed of, for example, a Central Processing Unit (CPU).

A current sensor 18 is provided between a source of the output transistor Q2 and ground. A signal from the current sensor 18 is supplied to an isolator 15. The isolator 15 has a configuration that is similar to that of the isolator 13. An output signal from the isolator 15 is supplied to an AD conversion circuit 16. The AD conversion circuit 16 converts an output signal from the isolator 15 into a digital value and supplies it to the arithmetic processing circuit 20.

The arithmetic processing circuit 20 integrates an output current $I_{d1}$ that is output, by the output transistor Q1 in an off-state thereof over a predetermined period of time when the output transistor Q1 is turned from an on-state thereof to an off-state thereof. The arithmetic processing circuit 20 compares a value of integral of an output current $I_{d1}$ with a predetermined threshold and outputs a detection signal Det that indicates a degradation state of the output transistor Q1 depending on a result of such comparison. For example, in a case where a value of integral of an output current $I_{d1}$ is less than a threshold, a detection signal Det at an H level that indicates that degradation is caused is output. Similarly, the arithmetic processing circuit 20 integrates an output current $I_{d2}$ that is output by the output transistor Q2 in an off-state thereof over a predetermined period of time when the output transistor Q2 is turned from an on-state thereof to an off-state thereof. The arithmetic processing circuit 20 compares a value of integral of an output current $I_{d2}$ with a predetermined threshold and outputs a detection signal Det that indicates a degradation state of the output transistor Q2 depending on a result of such comparison. Respective dram currents at a time when the output transistors Q1, Q2 are turned on are conveniently denoted by $I_{D1}$, $I_{D2}$.

A period of time when the arithmetic processing circuit 20 integrates an output current $I_{d1}$ of an output transistor Q1 is, for example, a period of time from a timing when the driving circuit 10 supplies a driving signal that shifts the output transistor Q1 from an on-state thereof to an off-state thereof to the output transistor Q1 to a timing when a driving signal that shifts the output transistor Q1 from an off-state thereof to an on-state thereof is supplied to the output transistor Q1.

Similarly, a period of time when the arithmetic processing circuit 20 integrates an output current $I_{d2}$ of the output transistor Q2 is, for example, a period of time from a timing when the driving circuit 10 supplies a driving signal that shifts the output transistor Q2 from an on-state thereof to an off-state thereof to the output transistor Q2 to a timing when a driving signal that shifts the output transistor Q2 from an off-state thereof to an on-state thereof is supplied to the output transistor Q2.

From a study, it has been known that an on-resistance of a GaN transistor has a correlation with a drain charge thereof. Therefore, in a case where GaN transistors are used as the output transistors Q1, Q2, drain charges that are released as output currents when the output transistors Q1, Q2 are shifted from on-states thereof to off-states thereof are detected, so that it is possible to detect states of on-resistances of the output transistors Q1, Q2.

For example, thresholds are set based on information of initial drain charges of the output transistors Q1, Q2 and values of integral of output currents $I_{d1}$, $I_{d2}$ of the output transistors Q1, Q2 during driving thereof are compared with the thresholds, so that it is possible to detect states of on-resistances of the output transistors Q1, Q2. As on-resistances of the output transistors Q1, Q2 are increased, power consumption thereof is increased. Therefore, it is possible to provide information of on-resistances of the output transistors Q1, Q2 as indices that indicate degradation states thereof.

The first embodiment has the arithmetic processing circuit 20 that integrates output currents $I_{d1}$, $I_{d2}$ of the output transistors Q1, Q2 after the output transistors Q1, Q2 are shifted from on-states thereof to off-states thereof over a predetermined period of time and compares such values of integral with predetermined thresholds. The arithmetic processing circuit 20 outputs detection signals Det depending on results of comparison. Detection signals Det indicate states of on-resistances of the output transistors Q1, Q2. Therefore, it is possible to find that on-resistances of the output transistors Q1, Q2 are increased and degradation thereof is caused, by detection signals Det. In a case where the output transistors Q1, Q2 compose output transistors of a DC/DC converter, it is possible to detect that power consumption of the DC/DC converter is increased by increases of on-resistances of the output transistors Q1, Q2.

Figure 2:
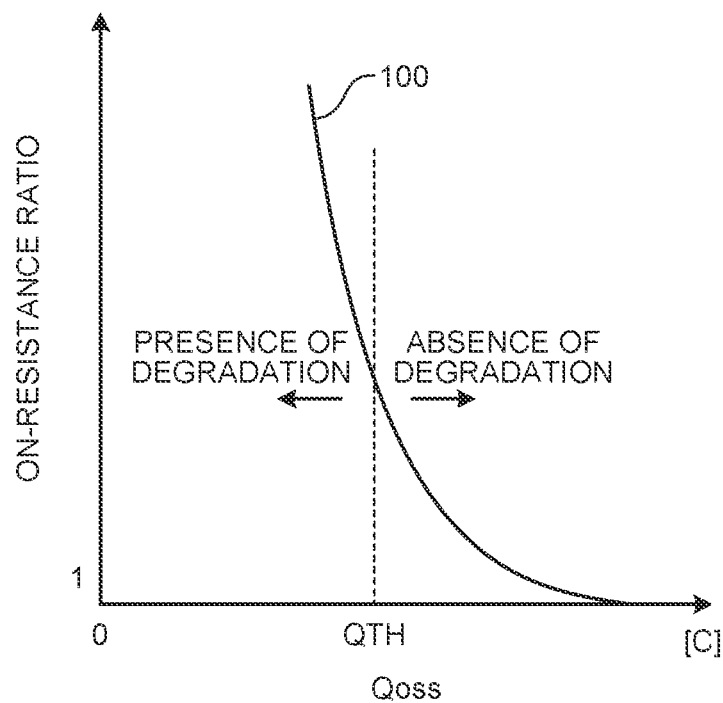
FIG. 2 is a diagram for explaining a degradation detection method.

FIG. 2 is a diagram for explaining a method of degradation detection for an output transistor, A horizontal axis represents a drain charge Qoss. A vertical axis represents a ratio of on-resistances (=an on-resistance at a time of detection/an initial on-resistance) of a GaN transistor. For an on-resistance and a drain charge of a GaN transistor, an on-resistance is decreased when a drain charge is increased and an on-resistance is increased when a drain charge is decreased, as indicated by a solid line 100. Therefore, for example, a threshold QTH is set based on an initial drain charge of an output transistor, and it is possible to determine a state where degradation is absent in the output transistor, in a case where a drain charge is the threshold QTH or greater, and determine that degradation is present in the output transistor, in a case where it is less than the threshold QTH. It is possible to detect a drain charge of an output transistor by integrating an output current that is output from the output transistor after the output transistor is shifted from an on-state thereof to an off-state thereof.

Figure 3:
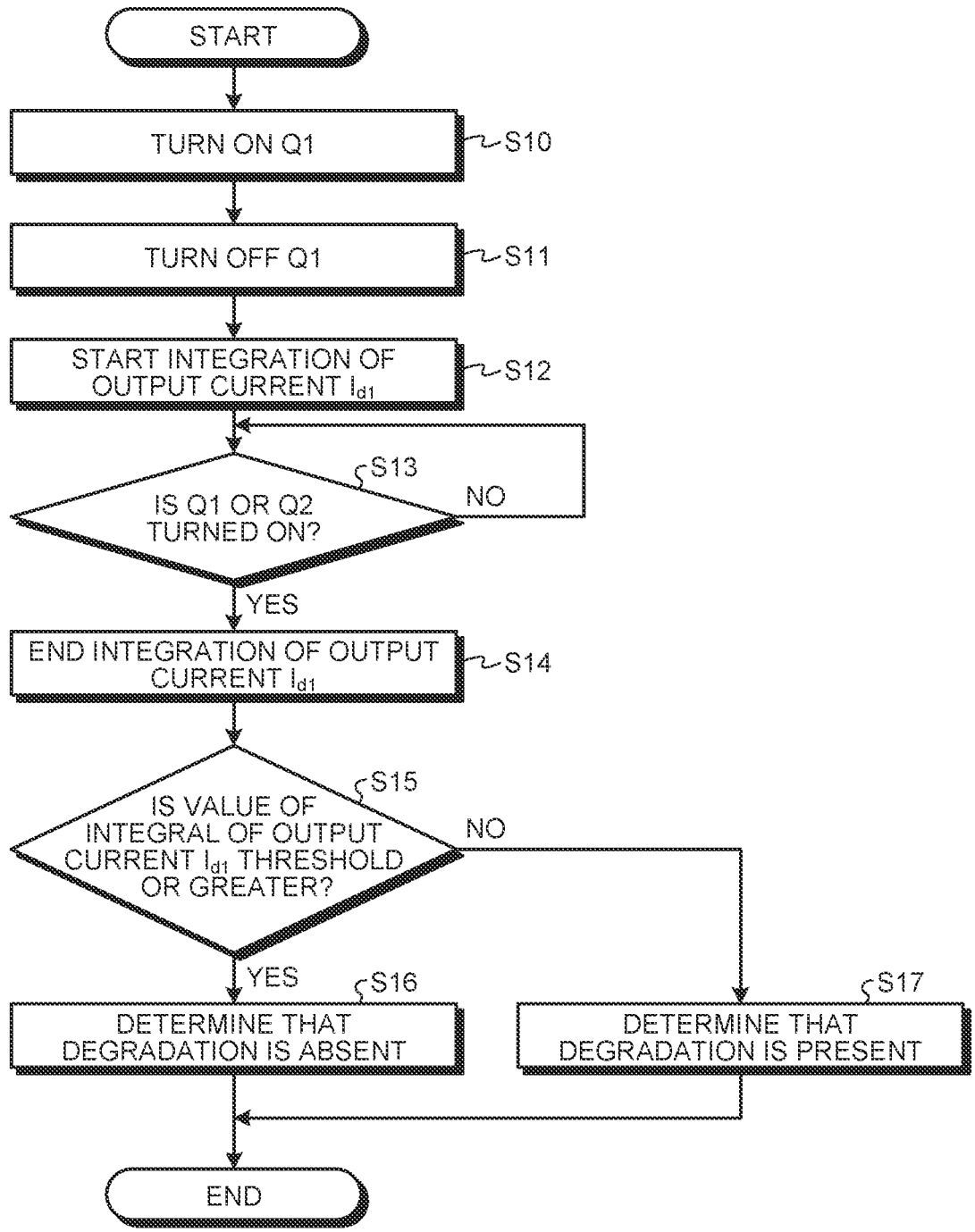
FIG. 3 is a flowchart that illustrates a degradation detection method.

FIG. 3 is a flowchart that illustrates a degradation detection method for an output transistor. It is implemented in the first embodiment as already described. A case where a degradation state of the output transistor Q1 is detected will be explained. The output transistor Q1 is turned on by a driving signal from the driving circuit 10 (S10). Then, the output transistor Q1 is turned off by a driving signal from the driving circuit 10 (S11).

Integration of an output current $I_{d1}$ that is output by the output transistor Q1 in an off-state thereof is started (S12). A timing when the output transistor Q1 is turned on/off is detected by information that is supplied from the driving circuit 10 to the arithmetic processing circuit 20. In a case where the output transistor Q1 or Q2 is turned on (S13: Yes), integration of an output current $I_{d1}$ of the output transistor Q1 is ended (S14). While the output transistor Q1 is provided in an off-state thereof (S13: No), integration of an output current $I_{d1}$ of the output transistor Q1 is continued.

After integration of an output current $I_{d1}$ is ended, a value of integral of an output current is compared with a predetermined threshold (S15). In a case where a value of integral of an output current $I_{d1}$ is a threshold or greater (S15: Yes), it is determined that degradation of the output transistor Q1 is absent (S16). In a case where a value of integral of an output current $I_{d1}$ is less than a threshold (S15: No), it is determined that degradation of the output transistor Q1 is present (S17).

When the output transistor Q1 is turned from an on-state thereof to an off-state thereof, an output current $I_{d1}$ that is output in the off-state is integrated, so that it is possible to detect a drain charge of the output transistor Q1. A state of an on-resistance of the output transistor Q1 is detected by detecting a drain charge of the output transistor Q1, so that it is possible to readily detect a degradation state thereof.

Also for the output transistor Q2, similarly, after the output transistor Q2 is shifted from an on-state thereof to an off-state thereof, an output current $I_{d2}$ that is output by the output transistor Q2 is integrated and a such a value of integral is compared with a threshold, so that a state of an on-resistance of the output transistor Q2 is detected where it is possible to readily detect a degradation state thereof. In a case where a degradation state of the output transistor Q2 is detected, it is possible to illustrate a flow where, in a flowchart as illustrated in FIG. 3, the output transistor Q1 is replaced with the output transistor Q2 and an output current $I_{d1}$ is replaced with an output current $I_{d2}$ of the output transistor Q2.

Second Embodiment

Figure 4:
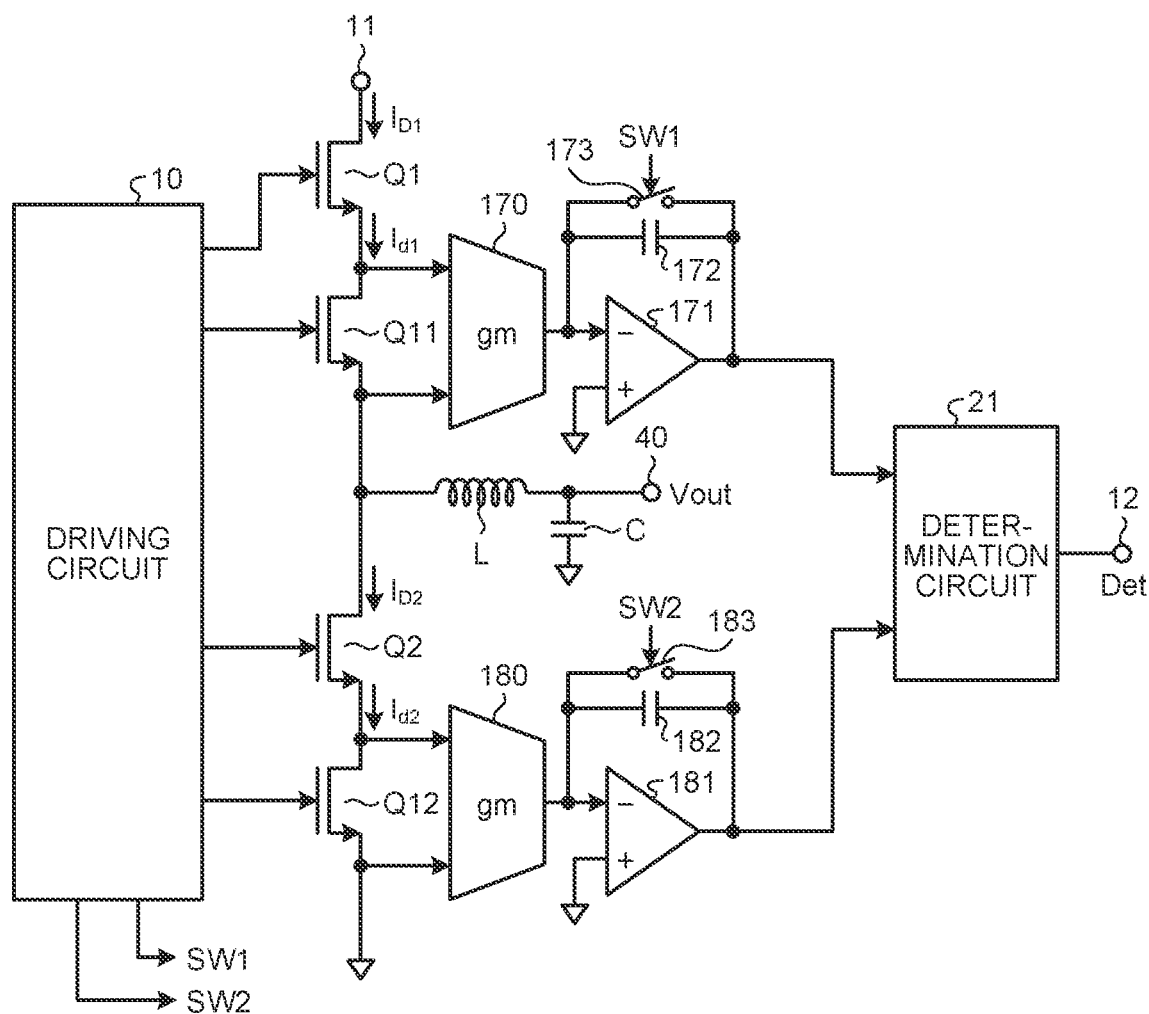
FIG. 4 is a diagram that illustrates a configuration of a degradation detection device according to a second embodiment.

FIG. 4 is a diagram that illustrates a configuration of a degradation detection device according to a second embodiment. A component that corresponds to that of an embodiment as already described will be provided with an identical sign so as to provide a redundant description only in case of need. Hereinafter, the same applies. The present embodiment has an output transistor Q11 that has a source-drain path that is connected in series with a source-drain path of an output transistor Q1 that is a main current path thereof. The output transistor Q11 is, for example, a Si transistor that is composed of Si.

A driving circuit 10 supplies driving signals to gates of the output transistors Q1, Q11. On/off of the output transistors Q1, Q11 is controlled by driving signals from the driving circuit 10. In a case where the output transistor Q1 is a GaN transistor, the output transistor Q1 is turned off by a driving signal at a negative voltage. In the present embodiment, the output transistor Q11 is constantly controlled so as to be provided in an on-state thereof.

The present embodiment has a voltage/current conversion circuit 170 with input terminals that are connected to a source and a drain of the output transistor Q11. The voltage/current conversion circuit 170 is composed of, for example, an Operational Transconductance Amplifier (OTA) that is called a Gm cell. The voltage/current conversion circuit 170 convers a voltage that is generated between the source and the drain of the output transistor Q11 into a current. For example, as a gain of the voltage/current conversion circuit 170 is gm and a voltage between the source and the drain of the output transistor Q11 is $V_{DS}$, a current of $gm \times V_{DS}$ is output from the voltage/current conversion circuit 170. An output current $I_{d1}$ of the output transistor Q1 is supplied to the output transistor Q11 and a voltage that is generated between the source and the drain of the output transistor Q11 by such an output current $I_{d1}$ is converted into a current by the voltage/current conversion circuit 170. Therefore, the voltage/current conversion circuit 170 outputs a current that is dependent on an output current $I_{d1}$ of the output transistor Q1.

An output current of the voltage/current conversion circuit 170 is supplied to an inverting input terminal (−) of an operational amplifier 171. A non-inverting input terminal (+) of the operational amplifier 171 is grounded. A capacitor 172 is connected between an output terminal of the operational amplifier 171 and the inverting input terminal (−). The operational amplifier 171 and the capacitor 172 compose an integration circuit. Therefore, a current that is supplied to the inverting input terminal (−) of the operational amplifier 171 is integrated by an integration circuit that is composed of the operational amplifier 171 and the capacitor 172 and is stored in the capacitor 172.

An integration circuit that is composed of the operational amplifier 171 and the capacitor 172 integrates a current that is supplied from the voltage/current conversion circuit 170 during a state where a switch 173 that is connected between both ends of the capacitor 172 is opened (that is, is turned off). As the switch 173 is shorted (that is, is turned on), a charge that is stored in the capacitor 172 is reset. On/off of the switch 173 is controlled by a control signal SW1 that is supplied from the driving circuit 10. As an output transistor Q2 is turned on, an output current $I_{d1}$ of the output transistor Q1 is supplied to the output transistor Q11. The driving circuit 10 supplies a control signal SW1 that opens the switch 173 to the switch 173 when a driving signal that turns on the output transistor Q2 is supplied to the output transistor Q2. An output signal of the operational amplifier 171 is supplied to a determination circuit 21.

The present embodiment has an output transistor Q12 that has a source-drain path that is connected in series with a source-drain path of the output transistor Q2 that is a main current path thereof. The output transistor Q12 is, for example, a Si transistor that is composed of Si.

The driving circuit 10 supplies driving signals to gates of the output transistors Q2, Q12. On/off of the output transistors Q2, Q12 is controlled by driving signals from the driving circuit 10. In a case where the output transistor Q2 is a GaN transistor, the output transistor Q2 is turned off by a driving signal at a negative voltage. In the present embodiment, the output transistor Q12 is constantly controlled so as to be provided in an on-state thereof.

The present embodiment has a voltage/current conversion circuit 180 with an input terminal that is connected to a source and a drain of the output transistor Q12. A configuration of the voltage/current conversion circuit 180 is similar to that of the voltage/current conversion circuit 170. The voltage/current conversion circuit 180 converts a voltage that is generated between the source and the drain of the output transistor Q12 into a current. An output current $I_{d2}$ of the output transistor Q2 is supplied to the output transistor Q12 and a voltage that is generated between the source and the drain of the output transistor Q12 by such an output current $I_{d2}$ is converted into a current by the voltage/current conversion circuit 180. Therefore, the voltage/current conversion circuit 180 outputs a current that is dependent on an output current $I_{d2}$ of the output transistor Q2.

An output current of the voltage/current conversion circuit 180 is supplied to an inverting input terminal (−) of an operational amplifier 181. A non-inverting input terminal (+) of the operational amplifier 181 is grounded. A capacitor 182 is connected between an output terminal of the operational amplifier 181 and the inverting input terminal (−). The operational amplifier 181 and the capacitor 182 compose an integration circuit. Therefore, a current that is supplied to the inverting input terminal (−) of the operational amplifier 181 is integrated by an integration circuit that is composed of the operational amplifier 161 and the capacitor 182 and is stored in the capacitor 182.

An integration circuit that is composed of the operational amplifier 181 and the capacitor 182 integrates a current that is supplied from the voltage/current conversion circuit 180 during a state where a switch 183 that is connected to both ends of the capacitor 182 is opened. As the switch 183 is shorted, a charge that is stored in the capacitor 182 is reset.

On/off of the switch 183 is controlled by a control signal SW2 that is supplied from the driving circuit 10. The driving circuit 10 supplies a control signal SW2 that opens the switch 183 to the switch 183 when a driving signal that turns on the output transistor Q1 is supplied to the output transistor Q1. An output signal of the operational amplifier 181 is supplied to the determination circuit 21.

The determination circuit 21 compares output signals that are supplied from the operational amplifiers 171, 181 with a predetermined threshold. A threshold is, for example, a threshold QTH that is set based on an initial drain charge as already described. The determination circuit 21 determines a state where degradation is absent in the output transistors Q1, Q2 in a case where values of output signals that are supplied from the operational amplifiers 171, 181 are a threshold QTH or greater, and determines that degradation is present in the output transistors Q1, Q2 in a case where they are less than the threshold QTH.

According to the present embodiment, output currents $I_{d1}$, $I_{d2}$ that are output in a state where each of the output transistors Q1, Q2 is shifted from an on-state thereof to an off-state thereof are integrated by integration circuits that are composed of the operational amplifiers 171, 181 and the capacitors 172, 182. Then, such values of integral and a threshold QTH are compared in the determination circuit 21 and degradation states of the output transistors Q1, Q2 are determined depending on results of such comparison. Output currents $I_{d1}$, $I_{d2}$ at a time when the output transistors Q1, Q2 are shifted from on-states thereof to off-states thereof are integrated, so that it is possible to detect drain charges thereof. Drain charges have correlations with on-resistances of the output transistors Q1, Q2. Therefore, drain charges of the output transistors Q1, Q2 are detected, so that it is possible to find states of on-resistances thereof and readily detect degradation states of the output transistors Q1, Q2.

Source-drain voltages of the output transistors Q11, Q12 that are formed of Si are voltages that are lower than that of a GaN transistor. Therefore, as a configuration is provided in such a manner that voltages between the sources and the drains of the output transistors Q11, Q12 are detected, it is possible to provide the voltage/current conversion circuits 170, 160 as simplified configurations where withstand voltages thereof are comparatively low.

The operational amplifiers 171, 181 may be composed of fully-differential operational amplifiers. It is possible to provide an integration circuit that is composed of a configuration where capacitors are respectively connected between an inverting input terminal and a non-inverting output terminal and between a non-inverting input terminal and an inverting output terminal of fully-differential operational amplifiers (non-illustrated).

Although some embodiments of the present invention have been explained, these embodiments are presented as examples and do not intend to limit the scope of the invention. These novel embodiments are capable of being implemented in various other modes and it is possible to execute a variety of omissions, substitutions, and modifications without departing from the spirit of the invention. These embodiments and/or variations thereof are included in the scope and/or spirit of the invention and are included in the scope of the invention as recited in what is claimed and equivalents thereof.

What is claimed is:

1. A degradation detection device, comprising:
    an output transistor with a source and a drain connected between a power source supply terminal and an output terminal;
    a driving circuit that supplies a driving signal that controls on/off of the output transistor to the output transistor; and
    an output circuit configured to:
        integrate an output current that is discharged from a source side of the output transistor according to a drain charge over a predetermined period of time when the output transistor is shifted from an on-state thereof to an off-state thereof;
        compare a value of an integral of the output current with a predetermined threshold; and
        output a signal that indicates that degradation of the output transistor is absent in response to the value of the integral being larger than the predetermined threshold and that the degradation of the output transistor is present in response to the value of the integral being smaller than the predetermined threshold.

2. The degradation detection device according to claim 1, wherein
    the predetermined period of time is a period of time from a timing when the driving circuit supplies a driving signal that shifts the output transistor from an on-state thereof to an off-state thereof to the output transistor to a timing when a driving signal that shifts the output transistor that is shifted to an off-state thereof to an on-state thereof is supplied to the output transistor.

3. The degradation detection device according to claim 1, further comprising:
    a second output transistor that has a main current path that is connected in series with the main current path of the output transistor and is supplied with the output current of the output transistor, wherein the output circuit includes:
    a voltage/current conversion circuit that converts a voltage that is generated on the main current path of the second output transistor into a current; and
    an integration circuit that integrates an output current of the voltage/current conversion circuit.

4. The degradation detection device according to claim 1, wherein
    the output transistor is a GaN (gallium nitride) transistor.

5. The degradation detection device according to claim 1, further comprising:
    an inductor with one end that is supplied with an output current of the output transistor; and
    an output capacitor with one end that is connected to the other end of the inductor and the other end that is grounded.

6. A degradation detection method, comprising:
    shifting an output transistor with a source and a drain connected between a power source supply terminal and an output terminal from an on-state thereof to an off-state thereof;
    integrating an output current that is discharged from a source side of the output transistor according to a drain charge over a predetermined period of time when the output transistor is shifted to the off-state thereof to obtain a value of an integral of the output current;
    comparing the value of the integral with a predetermined threshold; and
    outputting a signal that indicates that degradation of the output transistor is absent in response to the value of the integral being larger than the predetermined threshold and that the degradation of the output transistor is present in response to the value of the integral being smaller than the predetermined threshold.

7. The degradation detection method according to claim 6, wherein
    the output transistor is a GaN (gallium nitride) transistor.

8. The degradation detection method according to claim 6, further comprising
    supplying a driving signal that controls on/off of the output transistor to the output transistor, wherein
    the predetermined period of time is a period of time from a timing when the driving circuit supplies a driving signal that shifts the output transistor from an on-state thereof to an off-state thereof to the output transistor to a timing when a driving signal that shifts the output transistor from an off-state thereof to an on-state thereof is supplied to the output transistor.

9. The degradation detection method according to claim 6, further comprising
supplying the output current of the output transistor to a second output transistor that has a main current path that is connected in series with the main current path of the output transistor; and is supplied with the output current of the output transistor, wherein
the step of integrating includes converting a voltage that is generated on the main current path of the second output transistor by the output current into a current and integrating the current that is converted from the voltage.

10. A degradation detection device, comprising:
a first output transistor that has a main current path with one end that is connected to a power source supply terminal;
a second output transistor that has a main current path with one end that is connected to the other end of the main current path of the first output transistor and the other end that is connected to an output terminal;
a third output transistor that has a main current path with one end that is connected to the other end of the main current path of the second output transistor;
a fourth output transistor with one end that is connected to the other end of the main current path of the third output transistor and the other end that is grounded;
a driving circuit that supplies a driving signal that controls on/off of the first to fourth output transistors to the first to fourth output transistors; and
a determination circuit that compares a value of an integral of an output current that is output by the first output transistor in an off-state thereof over a predetermined period of time with a predetermined threshold when the first output transistor is turned from an on-state thereof to an off-state thereof, and outputs a signal that indicates a degradation state of the first output transistor depending on a result of such comparison.

11. The degradation detection device according to claim 10, wherein
the determination circuit compares a value of an integral of an output current that is output by the third output transistor in an off-state thereof over a predetermined period of time with a predetermined threshold when the third output transistor is turned from an on-state thereof to an off-state thereof, and outputs a signal that indicates a degradation state of the third output transistor depending on a result of such comparison.

12. The degradation detection device according to claim 10, further comprising:
an integration circuit that has:
a conversion circuit that converts a voltage that is generated on the main current path of the second output transistor into a current;
an amplification circuit with a first input terminal that is supplied with an output current of the conversion circuit and a second input terminal that is grounded; and
a capacitor that is connected between an output terminal of the amplification circuit and the first input terminal, wherein
an output signal of the integration circuit is supplied to the determination circuit.

13. The degradation detection device according to claim 12, comprising
a switch that is connected between both ends of the capacitor where on/off thereof is controlled by the driving circuit.

14. The degradation detection device according to claim 10, wherein
the predetermined period of time is a period of time from a timing when the driving circuit supplies a driving signal that shifts the first output transistor from an on-state thereof to an off-state thereof to the first output transistor to a timing when a driving signal that shifts the first output transistor that is shifted to an off-state thereof to an on-state thereof is supplied to the first output transistor.

15. The degradation detection device according to claim 10, wherein:
the first and third output transistors are GaN (gallium nitride) transistors; and
the second and fourth output transistors are Si (silicon) transistors.

16. The degradation detection device according to claim 10, wherein
the determination circuit determines that the first output transistor is not degraded in a case where the value of the integral is the predetermined threshold or greater.

17. The degradation detection device according to claim 10, further comprising:
an inductor with one end that is supplied with an output current of the second output transistor; and
an output capacitor with one end that is connected to the other end of the inductor and the other end that is grounded.

18. The degradation detection device according to claim 10, wherein
the driving circuit turns on/off the first and second output transistors in a complementary manner with respect to the third and fourth output transistors.

* * * * *